United States Patent
Kim (10) Patent No.: US 7,683,726 B2
(45) Date of Patent: Mar. 23, 2010

(54) QUADRATURE-PHASE VOLTAGE CONTROLLED OSCILLATOR

(75) Inventor: Chan Kyung Kim, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 12/078,851

(22) Filed: Apr. 7, 2008

(65) Prior Publication Data

US 2008/0252386 A1    Oct. 16, 2008

(30) Foreign Application Priority Data

Apr. 12, 2007    (KR) ...................... 10-2007-0036166

(51) Int. Cl.
    *H03B 27/00* (2006.01)
(52) U.S. Cl. .......................... 331/57; 331/45
(58) Field of Classification Search ............. 331/57, 331/46, 45
    See application file for complete search history.

(56) References Cited

U.S. PATENT DOCUMENTS 6,025,756 A * 2/2000 Miyabe .................... 331/57
6,819,189 B2 * 11/2004 Sudou et al. ................ 331/46
7,071,789 B2    7/2006 Gu
2005/0225400 A1   10/2005 Yoneya
2006/0267700 A1   11/2006 Kinoshita et al.

FOREIGN PATENT DOCUMENTS

JP    2004-096362    3/2004
JP    2005-312053    11/2005
JP    2006-339871    12/2006

* cited by examiner

*Primary Examiner*—Joseph Chang
(74) *Attorney, Agent, or Firm*—Harness, Dickey & Pierce (57) ABSTRACT

A voltage controlled oscillator (VCO) is provided. The VCO may include a first ring oscillation circuit that may have a plurality of delay cells and may output first differential oscillation signals, and a second ring oscillation circuit that may have a plurality of delay cells and may output second differential oscillation signals. The delay cells of the first ring oscillation circuit may be respectively cross-coupled to the corresponding delay cells of the second ring oscillation circuit. Each of the delay cells may include a differential amplification circuit that may output a first differential signal based on a first control signal, and a negative resistance circuit that may be connected in parallel to a pair of output terminals of the differential amplification circuit, may receive a second differential signal, may adjust the phase of the first differential signal based on a second control signal, and may then output the first differential signal.

18 Claims, 7 Drawing Sheets

QUADRATURE-PHASE VOLTAGE CONTROLLED OSCILLATOR

PRIORITY STATEMENT

This application claims priority under 35 U.S.C. §119 to Korean Patent Application No. 10-2007-0036166, filed on Apr. 12, 2007, in the Korean Intellectual Property Office, the entire contents of which are incorporated herein by reference.

BACKGROUND

1. Field

Example embodiments may relate to a voltage controlled oscillator (VCO), and more particularly, to a VCO for generating quadrature-phase clock signals.

2. Description of Related Art

A voltage controlled oscillator (VCO) is a circuit that may output a signal having a frequency that may be proportional or disproportional to a voltage applied from the outside. The VCO may be used in analog circuits or digital circuits, and particularly, in a phase locked loop (PLL) circuit, which may be employed in a radio data communication.

Examples of the VCO may include a ring oscillator and a LC oscillator, which may be selectively used according to their circuit characteristics. Recently, a complementary metal oxide semiconductor (CMOS) ring oscillator, which may be a highly integrated and low-cost circuit, has been widely used.

The CMOS ring oscillator may include an odd number of delay cells, and may have a ring structure in which a signal output from a delay cell of a last stage may be fed back to a delay cell of a first stage.

The total number of the delay cells of the ring oscillator may be inversely proportional to an output oscillation frequency. Thus, a 3-stage ring oscillator with three delay cells may be used in order to establish a high-speed data communication.

Two signals from among signals output from the 3-stage ring oscillator may be respectively phase-shifted by 120 degrees and 240 degrees with respect to the other signal.

However, quadrature-phase (4-phase) clock signals may be needed in order to reproduce data received or transmitted during a high-speed data communication. The 4-phase clock signals may also be needed in order to serialize or parallelize a data signal received or transmitted in a data pipeline stage of a semiconductor memory device, such as a dynamic random access memory (DRAM).

Thus, the ring oscillator with three delay cells may be suitable for transmission of data at high speeds but may not be suitable for a data communication requiring the 4-phase signals.

Either a ring oscillator with four delay cells or an additional circuit may be needed in order to generate the 4-phase clock signals that are phase shifted by 90 degrees with respect to one another.

Figure 1:
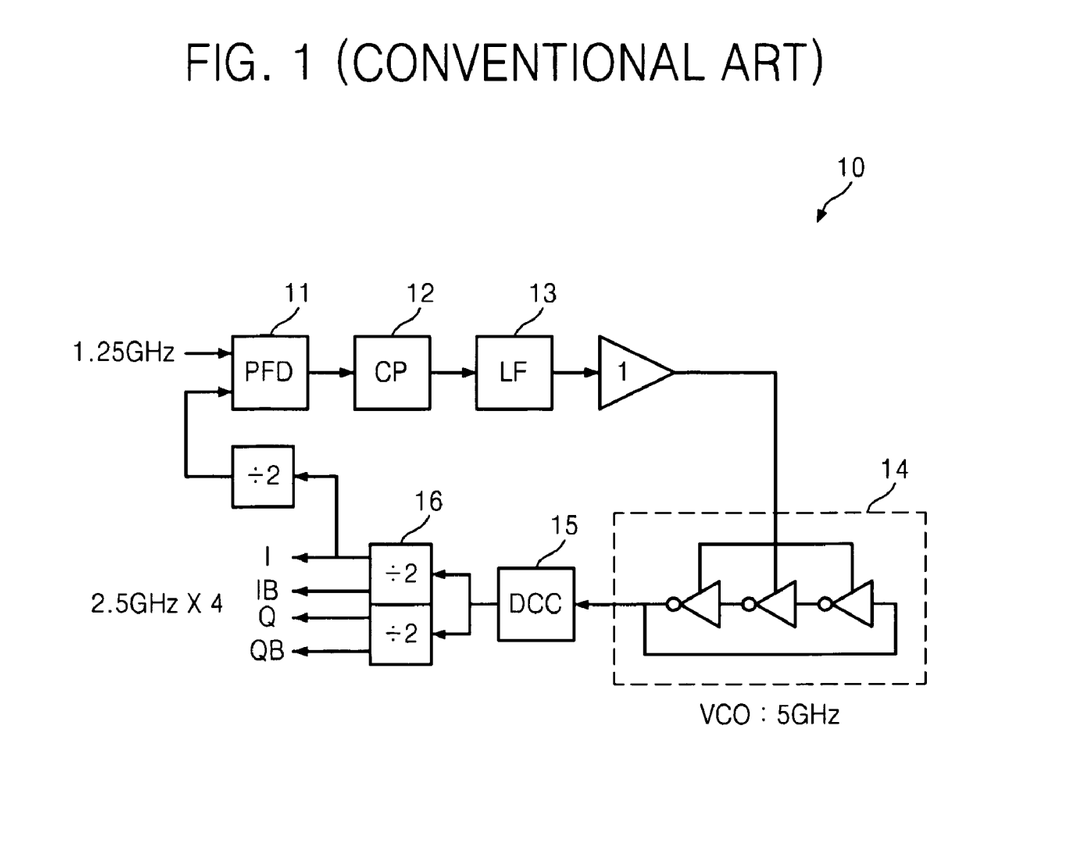
FIG. 1 is a circuit diagram of a conventional phase locked loop (PLL) circuit for generating a quadrature-phase (4-phase) clock signals.

FIG. 1 is a circuit diagram of a conventional PLL circuit 10 for generating 4-phase frequencies. Referring to FIG. 1, the PLL circuit 10 may have a phase/frequency detector 11, a charge pump 12, a loop filter 13, a VCO 14, a duty correction circuit 15, and a frequency divider 16. In the PLL circuit 10, in order to generate 4-phase clock signals I, IB, Q, and QB having a desired frequency, e.g., 2.5 GHz, the VCO 14 may generate a clock signal having a frequency, e.g., 5.0 GHz, which may be twice the value of a desired frequency. The clock signal may pass through the frequency divider 16, which may be embodied as a flip-flop, thus generating the 4-phase clock signals I, IB, Q, and QB having the desired frequency.

Therefore, in order to generate the 4-phase clock signals, an additional frequency divider may be needed, which may complicate the construction of a circuit.

SUMMARY

Example embodiments provide a voltage controlled oscillator (VCO) which may be used in a VCO circuit employing a ring oscillator, which may be capable of stably generating quadrature phase (4-phase) clock signals even during a high-speed data communication while reducing power consumption.

Example embodiments may provide a voltage controlled oscillator which may include a first ring oscillation circuit that may have a plurality of delay cells and may output first differential oscillation signals; and a second ring oscillation circuit that may have a plurality of delay cells and may output second differential oscillation signals, wherein the delay cells of the first ring oscillation circuit may be respectively cross-coupled to the corresponding delay cells of the second ring oscillation circuit.

Each of the delay cells may include a differential amplification circuit that may output a first differential signal based on a first control signal; and a negative resistance circuit that may be connected in parallel to a pair of output terminals of the differential amplification circuit, may receive a second differential signal, may adjust a phase of the first differential signal based on a second control signal, and may then, output the first differential signal.

The differential amplification circuit may include a first resistor that may be connected between a first power source and a first node, and a second resistor that may be connected between the first power source and a second node; a pair of input transistors that may receive a differential input signal, where one of the input transistors may be connected between the first node and a third node and the other input transistor may be connected between the second node and the third node; and a bias transistor that may be connected between the third node and a second power source and may be controlled by the first control signal.

The negative resistance circuit may include a pair of first transistors that may be cross-coupled to each other; a pair of second transistors that may be respectively connected in parallel to the first transistors and may receive the second differential signal; and a third transistor that may change a resistance of the corresponding delay cell in order to adjust a delay time of the delay cell, in response to the second control signal.

One of the first transistors may be connected between the first node and a fourth node, the other first transistor may be connected between the second node and the fourth node, and a gate terminal of each of the first transistors may be connected to a drain terminal of the other first transistor. One of the second transistors may be connected between the first node and the fourth node and the other second transistor may be connected between the second node and the fourth node. The third transistor may be connected between the fourth node and the second power source.

The second differential signal may be output from each of the delay cells of the second ring oscillation circuit that may be respectively cross-coupled to the delay cells of the first ring oscillation circuit, or each of the delay cells of the first ring oscillation circuit that may be respectively cross-coupled to the delay cells of the second ring oscillation circuit. A delay time of each of the delay cells may be changed based on a voltage of one of the first and second control signals.

Each of the first and second ring oscillation circuits may comprise three delay cells. The first differential oscillation signals and the second differential oscillation signals may be 4-phase clock signals that may be phase shifted by 90 degrees with respect to one another.

Example embodiments may provide a voltage controlled oscillator which may include a first ring oscillation circuit that may have first, second, and third delay cells; and a second ring oscillation circuit that may have fourth, fifth and sixth delay cells, wherein the first delay cell may be cross-coupled to the fourth delay cell, the second delay cell may be cross-coupled to the fifth delay cell, and the third delay cell may be cross-coupled to the sixth delay cell.

Each of the first through sixth delay cells may comprise a differential amplification circuit that may output a first differential signal based on a first control signal; and a negative resistance circuit that may be connected in parallel to a pair of output terminals of the differential amplification circuit, may receive a second differential signal, may adjust a phase of the first differential signal based on a second control signal, and may output the first differential signal.

The differential amplification circuit may include a first resistor that may be connected between a first power source and a first node, and a second resistor that may be connected between the first power source and a second node; a pair of input transistors that may receive a different input signal, where one of the input transistors may be connected between the first node and a third node and the other input transistor may be connected between the second node and the third node; and a bias transistor that may be connected between the third node and a second power source and may be controlled by the first control signal, wherein the first and second nodes may be the output terminals of the differential amplification circuit.

The negative resistance circuit may include a pair of first transistors that may be cross-coupled to each other; a pair of second transistors that may be respectively coupled in parallel to the first transistors and receive the second differential signal; and a third transistor that may change a resistance of the corresponding delay cell in order to adjust a delay time of the delay cell, in response to the second control signal.

One of the first transistors may be connected between the first node and a fourth node, the other first transistor may be connected between the second node and the fourth node, and a gate terminal of each of the first transistors may be connected to a drain terminal of the other first transistor. One of the second transistors may be connected between the first node and the fourth node, and the other second transistor may be connected between the second node and the fourth node. The third transistor may be connected between the fourth node and the second power source.

The second differential signal may be output from a corresponding one of the delay cells that may be respectively cross-coupled to the first through sixth delay cells.

The delay time of each of the first through sixth delay cell may be changed based on a voltage of one of the first and second control signals.

Signals output from the first and second ring oscillation circuits may be 4-phase clock signals that may be phase shifted by 90 degrees with respect to one another.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
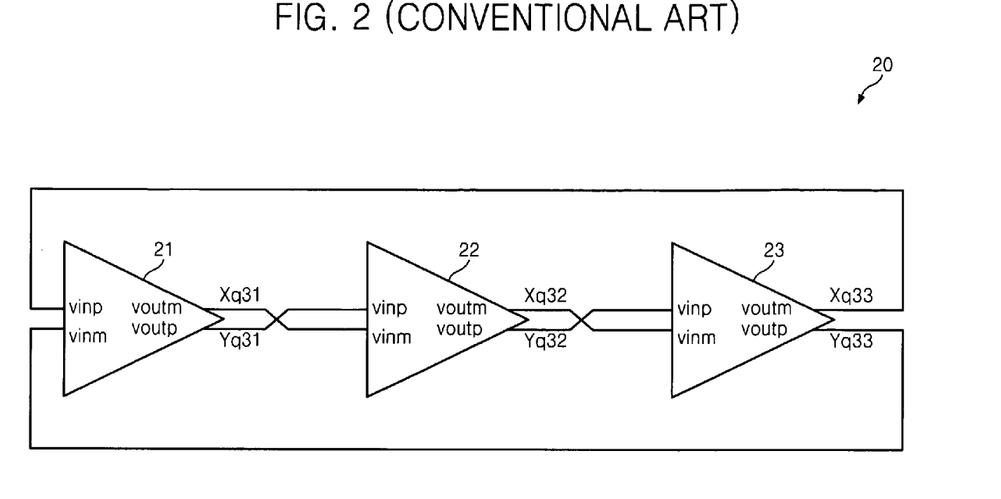
FIG. 2 is a schematic block diagram of a conventional 3-stage ring oscillator according to a related art.

FIG. 2 is a schematic block diagram of a general 3-stage ring oscillator 20 according to a related art. Referring to FIG. 2, the ring oscillator 20 may include a first delay cell 21, a second delay cell 22, and a third delay cell 23.

Signals Xq31 and Yq31, which may be output from the first delay cell 21, may be supplied to the second delay cell 22, and signals Xq32 and Yq32, which may be output from the second delay cell 22, may be supplied to the third delay cell 23. Signals Xq33 and Yq33, which may be output from the third delay cell 23, may be fed back to the first delay cell 21.

The first through third delay cells 21, 22, and 23 may form a feedback loop together, and may output oscillation signals that oscillate at desired frequency.

Each of the delay cells 21, 22, and 23 may have an output terminal. Signals output from the delay cells 21, 22, and 23 may have the same frequency but may be 120 degrees out of phase with one another.

That is, the signals Xq32 and Yq32, which may be output from the second delay cell 22, and the signals Xq33 and Yq33, which may be output from the third delay cell 23, may be respectively phase delayed by 120 degrees and 240 degrees with respect to the signals Xq31 and Yq31, which may be output from the first delay cell 21.

The ring oscillator 20, which may have the three delay cells 21, 22, and 23, may perform a high-speed oscillation operation in a circuit that requires a high-speed operation but may not be used in a circuit that requires 4-phase clock signals in a data communication.

Figure 3:
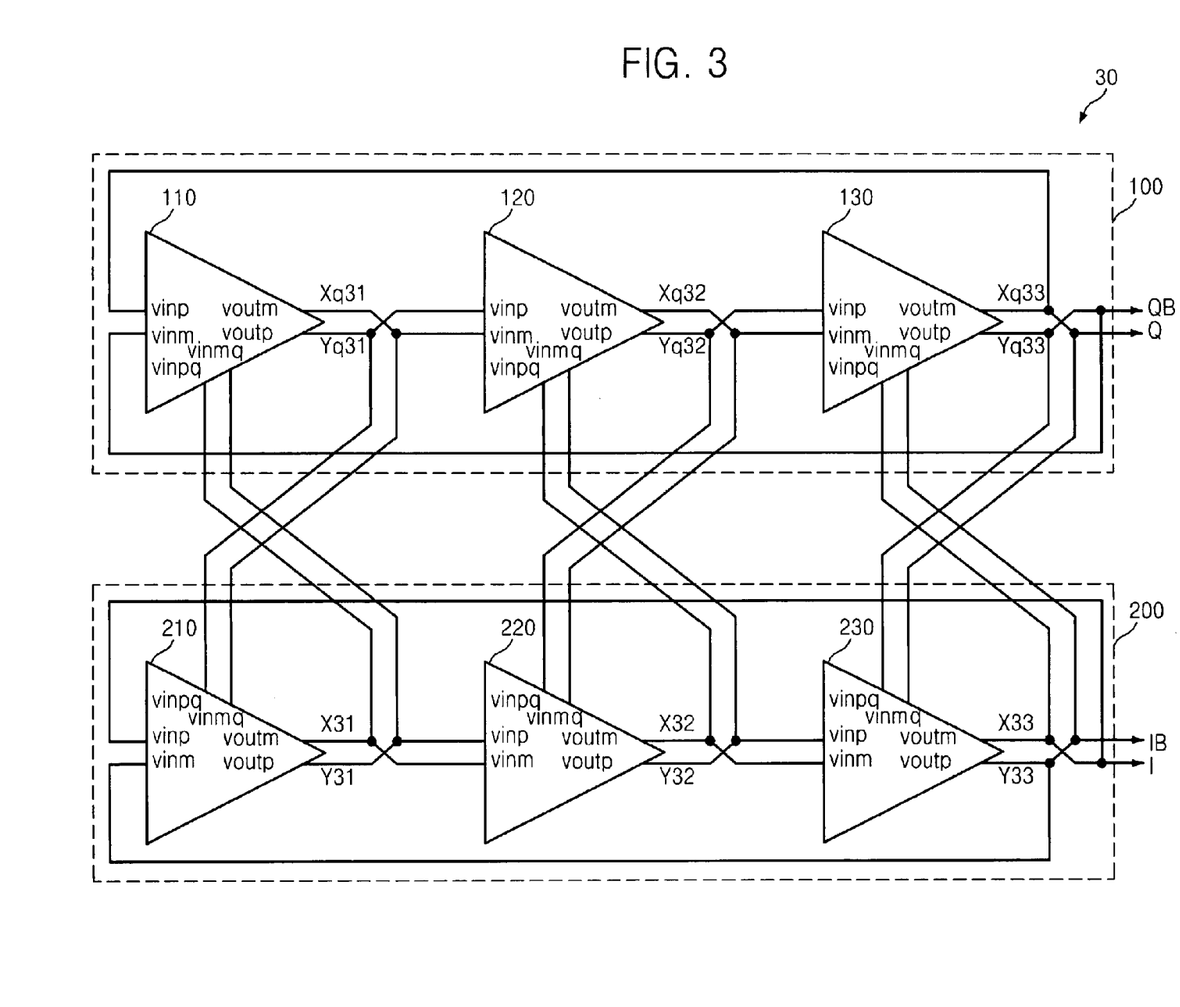
FIG. 3 is a schematic block diagram of a voltage controlled oscillator (VCO) according to example embodiments.

FIG. 3 is a schematic block diagram of a VCO 30 according to example embodiments. Referring to FIG. 3, the VCO 30 may include a first ring oscillation circuit 100 and a second ring oscillation circuit 200.

The first ring oscillation circuit 100 may include a plurality of delay cells 110, 120, and 130 and the second ring oscillation circuit 200 may include a plurality of delay cells 210, 220, and 230. The delay cells 110 through 130 of the first ring oscillation circuit 100 may be respectively cross-coupled to the corresponding delay cells 210 through 230 of the second ring oscillation circuit 200.

More specifically, referring to FIG. 3, the first ring oscillation circuit 100 may include first through third delay cells 110, 120, and 130, and the second ring oscillation circuit 200 may include fourth through sixth delay cells 210, 220, and 230.

The first delay cell 110 may be cross-coupled to the fourth delay cell 210, the second delay cell 120 may be cross-coupled to the fifth delay cell 220, and the third delay cell 130 may be cross-coupled to the sixth delay cell 230.

The first oscillation circuit 100 and the second oscillation circuit 200 may individually form a feedback loop. The first oscillation circuit 100 may output first differential frequency signals Q and QB which may have a desired frequency, and the second oscillation circuit 200 may output second differential frequency signals I and IB which may have the desired frequency.

The first differential frequency signals Q and QB which may be output from the first oscillation circuit 100 and the second differential frequency signals I and IB which may be output from the second oscillation circuit 200 may be 4-phase (or orthogonal phase) signals that may be phase shifted by 90 degrees with respect to one another.

More specifically, the third delay cell 130 may output the first differential frequency signals Q and QB, and the sixth delay cell 230 may output the second differential frequency signals I and IB that may be respectively phase shifted by 90 degrees with respect to the first differential frequency signals Q and QB.

The first differential frequency signals Q and QB may have the same frequency as the second differential frequency signals I and IB.

The constructions of and the linking relationship between the delay cells 110 through 230 will be described later with reference to FIG. 4.

Figure 4:
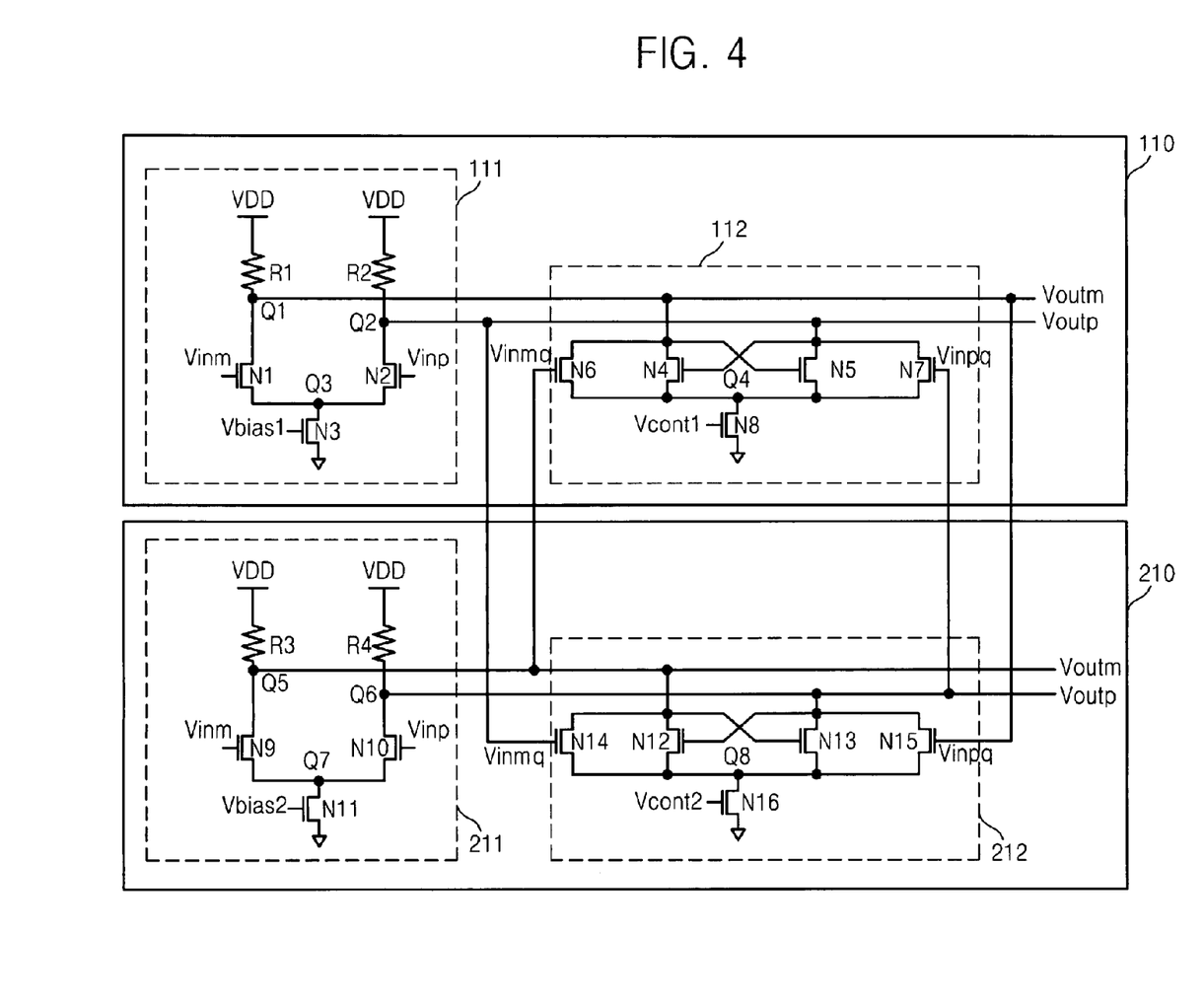
FIG. 4 is a circuit diagram of delay cells illustrated in FIG. 3 according to example embodiments.

FIG. 4 is a circuit diagram of the first and fourth delay cells 110 and 210 illustrated in FIG. 3. In detail, FIG. 4 may illustrate the relationship between the first delay cell 110 and the fourth delay cell 210 that may be cross-coupled to each other.

The delay cells 110 through 230 may have the same construction and operation. Thus, the constructions of and the linking relationship between the delay cells 110 through 230 will be described based on the first and fourth delay cells 110 and 210.

Referring to FIGS. 3 and 4, the first delay cell 110 may include a first differential amplification circuit 111 and a first negative resistance circuit 112.

The first differential amplification circuit 111 may include a first resistor R1, a second resistor R2, and first through third NMOS transistors N1, N2, and N3. The first resistors R1 may be connected between a power source terminal VDD and a first node Q1, and the second resistor R2 may be connected between the power source terminal VDD and a second node Q2.

The first NMOS transistor N1 may be connected between the first node Q1 and a third node Q3. The second NMOS transistor N2 may be connected between the second node Q2 and the third node Q3. The third NMOS transistor N3 may be connected between the third node Q3 and a ground terminal GND.

The first differential amplification circuit 111 may receive differential input signals Vinm and Vinp, and may output differential output signals Voutm and Voutp in response to a first control signal Vbias1.

In detail, the first differential amplification circuit 111 may control the frequencies of the differential output signals Voutm and Voutp based on the voltage of the first control signal Vbias1 which may be supplied to a gate terminal of the third NMOS transistor N3, and may then output the differential output signals Voutm and Voutp.

The third NMOS transistor N3 may be a bias transistor controlled by the first control signal Vbias1.

The frequencies of the differential output signals Voutm and Voutp, which may be output from the first differential amplification circuit 111, may increase to be proportional to the voltage of the first control signal Vbias1.

The first negative resistance circuit 112 may include fourth through eighth NMOS transistors N4, N5, N6, N7, and N8, and may be connected in parallel to the first and second nodes Q1 and Q2 that may be a pair of output terminals of the first differential amplification circuit 111.

The resistance of the first negative resistance circuit 112 may change in response to a second control signal Vcont1, which may result in changing a delay time of the first delay cell 110.

The fourth NMOS transistor N4 may be connected between the first node Q1 and a fourth node Q4, and the fifth NMOS transistor N5 may be connected between the second node Q2 and the fourth node Q4. The fourth NMOS transistor N4 may be cross-coupled to the fifth NMOS transistor N5.

That is, a gate terminal of the fourth NMOS transistor N4 may be connected to a drain terminal of the fifth NMOS transistor N5, and a gate terminal of the fifth NMOS transistor N5 may be connected to a drain terminal of the fourth NMOS transistor N4.

The sixth NMOS transistor N6 may be connected in parallel to the fourth NMOS transistor N4, the seventh NMOS transistor N7 may be connected in parallel to the fifth NMOS transistor N5, and the eighth NMOS transistor N8 may be connected between the fourth node Q4 and the ground terminal GND.

The sixth NMOS transistor N6 and the seventh NMOS transistor N7 may be transistors for receiving differential signals output from the fourth delay cell 210 which may be cross-coupled to the first delay cell 110.

According to example embodiments, a gate terminal of the sixth NMOS transistor N6 may receive one of the differential signals output from the fourth-delay cell 210, e.g., a signal which may be output from a fifth node Q5. A gate terminal of the seventh NMOS transistor N7 may receive the other differential signal output from the fourth delay cell 210, e.g., a signal which may be output from a sixth node Q6.

The delay time of the first delay cell 110 may be embodied to be changed based on the first control signal Vbias1 and/or the second control signal Vcont1.

The fourth delay cell 210 may include a second differential amplification circuit 211 and a second negative resistance circuit 212.

The second differential amplification circuit 211 may include a third resistor R3, a fourth resistor R4, and ninth through eleventh NMOS transistors N9, N10, and N11. The third resistor R3 may be connected between the power source terminal VDD and the fifth node Q5, and the fourth resistor R4 may be connected between the power source terminal VDD and the sixth node Q6.

The ninth NMOS transistor N9 may be connected between the fifth node Q5 and a seventh node Q7, and the tenth NMOS transistor N10 may be connected between the sixth node Q6 and the seventh node Q7. The eleventh NMOS transistor N11 may be connected between the seventh node Q7 and the ground terminal GND.

The second differential amplification circuit 211 may receive the differential input signals Vinm and Vinp, and may output the differential output signals Voutm and Voutp in response to a third control signal Vbias2.

More specifically, the second differential amplification circuit 211 may control the frequencies of the differential output signals Voutm and Voutp based on the voltage of the third control signal Vbias2, which may be supplied to a gate terminal of the eleventh NMOS transistor N11, and then may output the differential output signals Voutm and Voutp.

The eleventh NMOS transistor N11 may be a bias transistor controlled by the third control signal Vbias2.

The second negative resistance circuit 212 may include twelfth through sixteenth NMOS transistors N12, N13, N14, N15, and N16, and may be connected in parallel to the fifth and sixth nodes Q5 and Q6 that may be a pair of output terminals of the second differential amplification circuit 211.

The resistance of the second negative resistance circuit 212 may change in response to a fourth control signal Vcont2, which may result in changing a delay time of the fourth delay cell 210.

The twelfth NMOS transistor N12 may be connected between the fifth node Q5 and an eighth node Q8, and the thirteenth NMOS transistor N13 may be connected between the sixth node Q6 and the eighth node Q8.

The twelfth NMOS transistor N12 may be cross-coupled to the thirteenth NMOS transistor N13. According to example embodiments, a gate terminal of the twelfth NMOS transistor N12 may be connected to a drain terminal of the thirteenth NMOS transistor N13, and a gate terminal of the thirteenth NMOS transistor N13 may be connected to a drain terminal of the twelfth NMOS transistor N12.

The fourteenth NMOS transistor N14 may be connected in parallel to the twelfth NMOS transistor N12, and the fifteenth NMOS transistor N15 may be connected in parallel to the thirteenth NMOS transistor N13.

The sixteenth NMOS transistor N16 may be connected between the eighth node Q8 and the ground terminal GND.

The fourteenth NMOS transistor N14 and the fifteenth NMOS transistor N15 may be transistors for receiving differential output signals from the first delay cell 110 which may be cross-coupled to the fourth delay cell 210.

That is, a gate terminal of the fourteenth NMOS transistor N14 may receive one of the differential output signals from the first delay cell 110, e.g., a signal which may be output from the second node Q2, and a gate terminal of the fifteenth NMOS transistor N15 may receive the other differential output signal from the first delay cell 110, e.g., a signal which may be output from the first node Q1.

The delay time of the fourth delay cell 210 may be embodied to be changed based on the third control signal Vbias2 and/or the fourth control signal Vcont2.

The constructions of and the linking relationship between the second delay cell 120 and the fifth delay cell 220 and the constructions of and the linking relationship between the third delay cell 130 and the sixth delay cell 230, may be identical to the constructions and the linking relationship between the first delay cell 110 and the fourth delay cell 210, which have been described above with reference to FIG. 4.

Figure 5A:
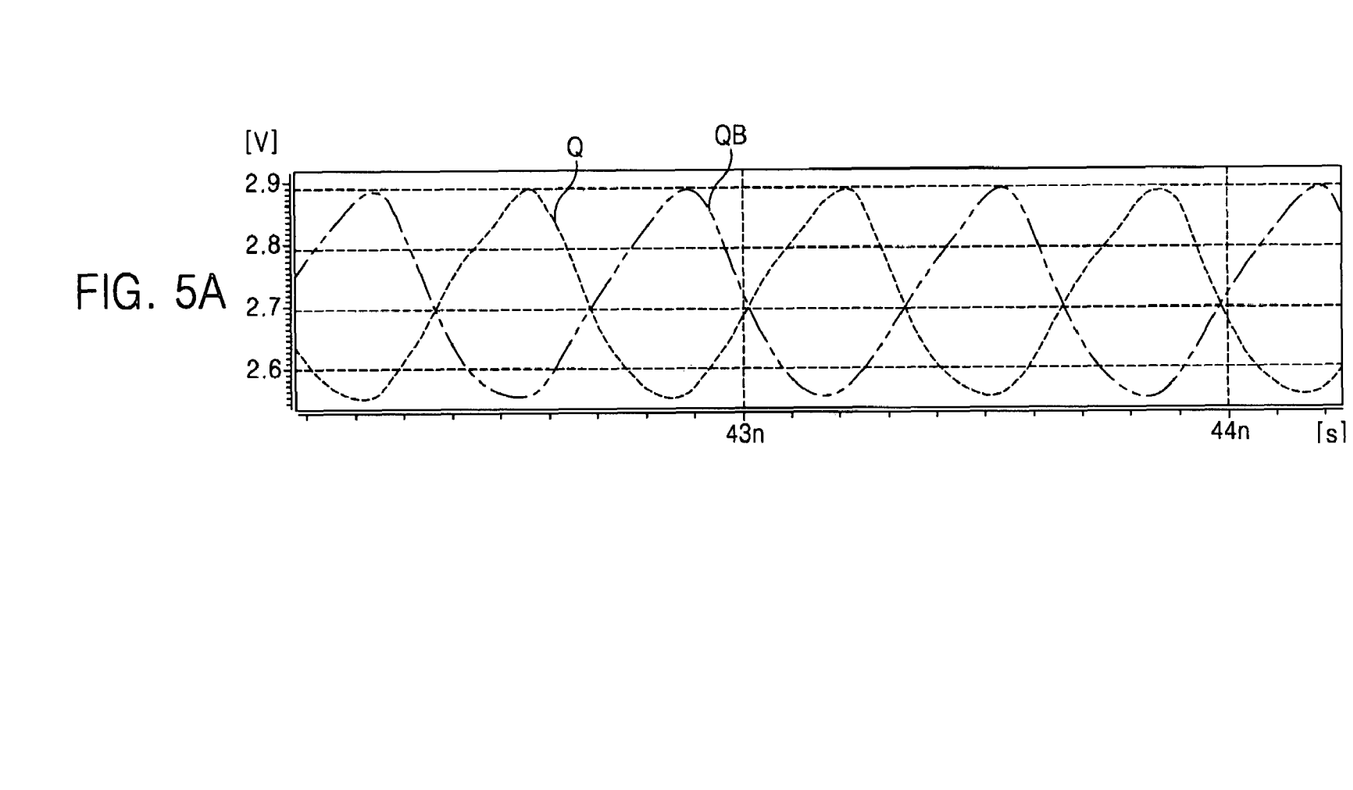
FIGS. 5A through 5C are timing diagrams illustrating the result of simulation performed on a VCO according to example embodiments.
Figure 5B:
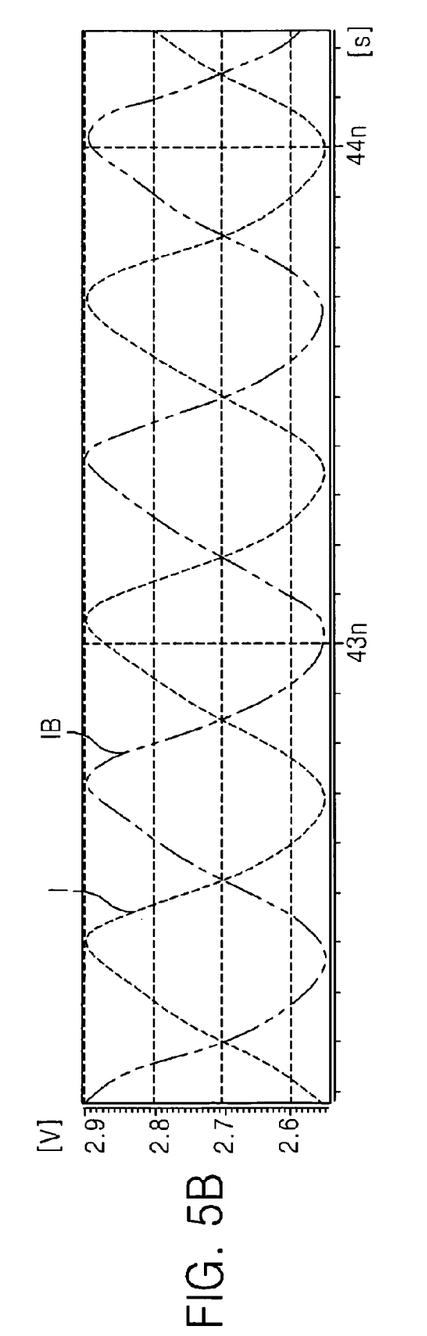
Figure 5C:
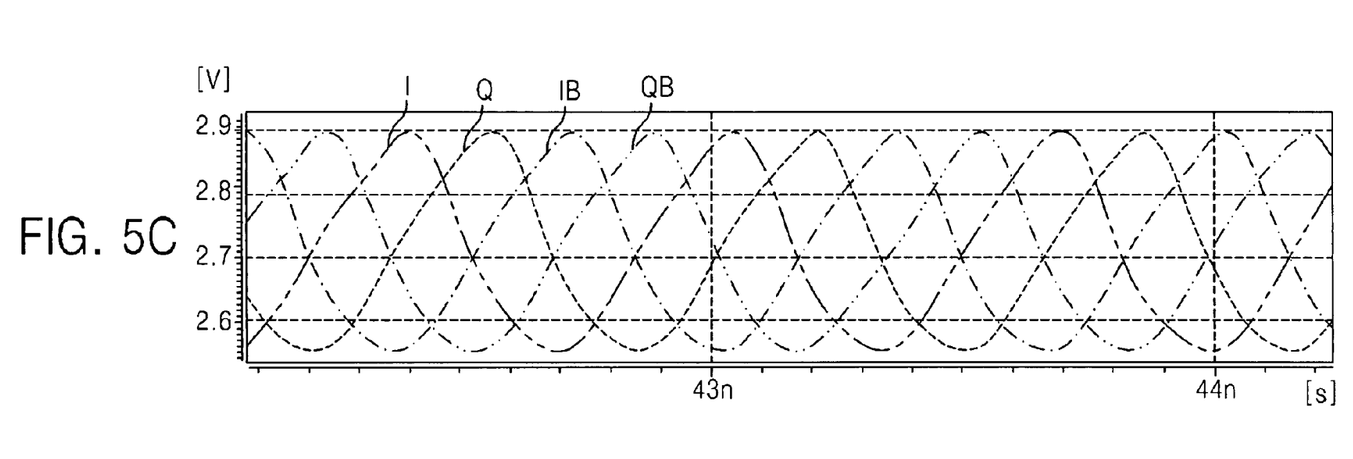

FIGS. 5A through 5C are timing diagrams illustrating the result of a simulation performed on a VCO according to example embodiments. In detail, FIG. 5A is a timing diagram of signals Q and QB output from the first ring oscillation circuit 100 illustrated in FIG. 3. FIG. 5B is a timing diagram of signals I and IB output from the second ring oscillation circuit 200 illustrated in FIG. 3. FIG. 5C is a timing diagram illustrating the relationship between the phases of the signals Q and QB output from the first ring oscillation circuit 100 and the signals I and IB output from the second ring oscillation circuit 200.

Referring to FIGS. 3 through 5C, the VCO 30 illustrated in FIG. 3 may accurately output 4-phase clock signals. According to example embodiments, the signals Q and QB, which may be output from the first ring oscillation circuit 100, and the signals I and IB, which may be output from the second ring oscillation circuit 200, may be respectively phase shifted by 90 degrees with respect to one another.

As described above, a VCO according to example embodiments may not only output a high-speed oscillation frequency suitable for high-speed transmission of data but may also generate 4-phase frequency signals.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A voltage controlled oscillator comprising:
 a first ring oscillation circuit having a first plurality of delay cells; and
 a second ring oscillation circuit having a second plurality of delay cells,
 wherein each delay cell in the first plurality of delay cells of the first ring oscillation circuit is cross-coupled to a corresponding delay cell from among the second plurality of delay cells of the second ring oscillation circuit, and
 wherein the first plurality of delay cells are configured to output first differential oscillation signals, and the second plurality of delay cells are configured to output second differential oscillation signals.

2. The voltage controlled oscillator of claim 1, wherein each delay cell, from among the first and second pluralities of delay cells, comprises:
 a differential amplification circuit for outputting a first differential signal based on a first control signal; and
 a negative resistance circuit connected in parallel to a pair of output terminals of the differential amplification circuit, the negative resistance circuit being configured to receive a second differential signal, adjust a phase of the first differential signal based on a second control signal, and output the first differential signal.

3. The voltage controlled oscillator of claim 2, wherein the negative resistance circuit comprises:
 a pair of first transistors, the pair of first transistors being cross-coupled to each other;
 a pair of second transistors, the pair of second transistors being respectively connected in parallel to the pair of first transistors, and being configured to receive the second differential signal: and
 a third transistor, the third transistor being configured to change a resistance of the delay cell of which the negative resistance circuit is a part in order to adjust a delay time of the delay cell, in response to the second control signal.

4. The voltage controlled oscillator of claim 3, wherein the differential amplification circuit comprises:
 a first resistor connected between a first power source and a first node, and a second resistor connected between the first power source and a second node;
 a pair of input transistors, the pair of input transistors being configured to receive a differential input signal, where one of the input transistors is connected between the first node and a third node and the other input transistor is connected between the second node and the third node; and
 a bias transistor connected between the third node and a second power source, the bias transistor being configured to be controlled by the first control signal,
 wherein the first node and the second node are the output terminals of the differential amplification circuit.

5. The voltage controlled oscillator of claim 4, wherein one transistor of the pair of first transistors is connected between the first node and a fourth node, the other transistor of the pair of first transistors is connected between the second node and the fourth node, and a gate terminal of each of the pair of first transistors is connected to a drain terminal of the other first transistor of the pair of first transistors,
 one of the second transistors of the pair of second transistors is connected between the first node and the fourth node and the other second transistor of the pair of second transistors is connected between the second node and the fourth node, and
 the third transistor is connected between the fourth node and the second power source.

6. The voltage controlled oscillator of claim 2, wherein the voltage controlled oscillator is configured so that the second differential signal is output from each of the second plurality of delay cells of the second ring oscillation circuit that are respectively cross-coupled to the first plurality of delay cells of the first ring oscillation circuit or each of the first plurality of delay cells of the first ring oscillation circuit that are respectively cross-coupled to the second plurality of delay cells of the second ring oscillation circuit.

7. The voltage controlled oscillator of claims 2, wherein the voltage controlled oscillator is configured so that a delay time of each of the delay cells changes based on a voltage of one of the first and second control signals.

8. The voltage controlled oscillator of claim 1, wherein each of the first and second ring oscillation circuits comprises three delay cells.

9. The voltage controlled oscillator of claim 1, wherein the first differential oscillation signals and the second differential oscillation signals are 4-phase clock signals that are phase shifted by 90 degrees with respect to one another.

10. The voltage controlled oscillator of claim 1, wherein
 the first ring oscillation circuit includes first, second, and third delay cells,
 the second ring oscillation circuit includes fourth, fifth and sixth delay cells; and
 wherein the first delay cell is cross-coupled to the fourth delay cell, the second delay cell is cross-coupled to the fifth delay cell, and the third delay cell is cross-coupled to the sixth delay cell.

11. The voltage controlled oscillator of claim 10, wherein each of the first through sixth delay cells comprises:
 a differential amplification circuit, the differential amplification circuit being configured to output a first differential signal based on a first control signal; and
 a negative resistance circuit connected in parallel to a pair of output terminals of the differential amplification circuit, the negative resistance circuit being configured to receive a second differential signal, adjust a phase of the first differential signal based on a second control signal, and output the first differential signal.

12. The voltage controlled oscillator of claim 11, wherein the negative resistance circuit comprises:
 a pair of first transistors, the pair of first transistors being cross-coupled to each other;
 a pair of second transistors, the pair of second transistors being respectively cross-coupled in parallel to the pair of first transistors, and receiving the second differential signal; and
 a third transistor, the third transistor being configured to change a resistance of the corresponding delay cell in order to adjust a delay time of the delay cell, in response to the second control signal.

13. The voltage controlled oscillator of claim 12, wherein the differential amplification circuit comprises:
 a first resistor connected between a first power source and a first node, and a second resistor connected between the first power source and a second node;
 a pair of input transistors, the pair of input transistors being configured to receive a differential input signal, where one of the input transistors is connected between the first node and a third node and the other input transistor is connected between the second node and the third node; and a bias transistor connected between the third node and a second power source, and controlled by the first control signal, wherein the first and second nodes are the output terminals of the differential amplification circuit.

14. The voltage controlled oscillator of claim 13, wherein one of the first transistors is connected between the first node and a fourth node, the other first transistor is connected between the second node and the fourth node, and a gate terminal of each of the first transistors is connected to a drain terminal of the other first transistor, one of the second transistors is connected between the first node and the fourth node, and the other second transistor is connected between the second node and the fourth node, and the third transistor connected between the fourth node and the second power source.

15. The voltage controlled oscillator of claim 11, wherein the second differential signal is output from a corresponding delay cell of the delay cells that are respectively cross-coupled to the first through sixth delay cells.

16. The voltage controlled oscillator of claim 11, wherein a delay time of each of the first through sixth delay cell is changed based on a voltage of one of the first and second control signals.

17. The voltage controlled oscillator of claim 10, wherein signals output from the first and second ring oscillation circuits are 4-phase clock signals that are phase shifted by 90 degrees with respect to one another.

18. A voltage controlled oscillator comprising:

a first ring oscillation circuit having a first plurality of delay cells, the first ring oscillation circuit including first, second, and third delay cells; and a second ring oscillation circuit having a second plurality of delay cells, the second ring oscillation circuit includes fourth, fifth and sixth delay cells, wherein each delay cell in the first plurality of delay cells of the first ring oscillation circuit is cross-coupled to a corresponding delay cell from among the second plurality of delay cells of the second ring oscillation circuit, wherein the first delay cell is cross-coupled to the fourth delay cell, the second delay cell is cross-coupled to the fifth delay cell, and the third delay cell is cross-coupled to the sixth delay cell, and wherein each of the first through sixth delay cells includes
a differential amplification circuit, the differential amplification circuit being configured to output a first differential signal based on a first control signal; and
a negative resistance circuit connected in parallel to a pair of output terminals of the differential amplification circuit, the negative resistance circuit being configured to receive a second differential signal, adjust a phase of the first differential signal based on a second control signal, and output the first differential signal.

* * * * *